(12) United States Patent
Woo

(10) Patent No.: US 10,660,198 B2
(45) Date of Patent: May 19, 2020

(54) ELECTRONIC DEVICE

(71) Applicant: LG ELECTRONICS INC., Seoul (KR)

(72) Inventor: Seungmin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 51 days.

(21) Appl. No.: 16/141,841

(22) Filed: Sep. 25, 2018

(65) Prior Publication Data

US 2019/0098750 A1 Mar. 28, 2019

Related U.S. Application Data

(60) Provisional application No. 62/564,222, filed on Sep. 27, 2017.

(30) Foreign Application Priority Data

Feb. 21, 2018 (KR) .................. 10-2018-0020712

(51) Int. Cl.
*H01Q 1/48* (2006.01)
*H05K 1/02* (2006.01)
(Continued)

(52) U.S. Cl.
CPC ............. *H05K 1/0271* (2013.01); *H01Q 1/48* (2013.01); *H01Q 1/521* (2013.01); *H01Q 9/045* (2013.01); *H01Q 21/065* (2013.01); *H05K 1/0236* (2013.01); *H05K 1/115* (2013.01); *H05K 1/181* (2013.01); *H05K 1/0298* (2013.01); *H05K 2201/10098* (2013.01)

(58) Field of Classification Search
CPC .......... H01G 1/48; H01G 1/521; H01G 9/045; H01G 21/065; H01G 15/006
See application file for complete search history.

(56) References Cited

U.S. PATENT DOCUMENTS

2014/0354513 A1 12/2014 Nair et al.

FOREIGN PATENT DOCUMENTS

| JP | 2014175438 | 9/2014 |
|---|---|---|
| JP | 2016039541 | 3/2016 |

(Continued)

OTHER PUBLICATIONS

PCT International Application No. PCT/KR2018/004030, Written Opinion of the International Searching Authority dated Jul. 17, 2018, 9 pages.

*Primary Examiner* — Graham P Smith
(74) *Attorney, Agent, or Firm* — Lee, Hong, Degerman, Kang & Waimey PC

(57) ABSTRACT

The present disclosure relates to an electronic device, and the electronic device may include a circuit board provided within a main body of the electronic device, on which a conductive layer made of a conductive material and a dielectric layer made of an insulating material are alternately laminated; at least one or more patch antennas disposed on the circuit board; a core layer located at a central portion inside the circuit board, and configured with any one of the dielectric layers; a ground layer disposed below the core layer; and an EBG structure located inside the circuit board in a symmetrical shape at the top and bottom with respect to the core layer, and the EBG structure restricts operating frequency signals radiated from the respective patch antennas from being interfered with each other.

19 Claims, 15 Drawing Sheets

(51) Int. Cl.
*H01Q 9/04* (2006.01)
*H01Q 21/06* (2006.01)
*H05K 1/18* (2006.01)
*H05K 1/11* (2006.01)
*H01Q 1/52* (2006.01)

(56) References Cited

FOREIGN PATENT DOCUMENTS

| | | |
|---|---|---|
| JP | 2016220029 | 12/2016 |
| KR | 1020110126488 | 11/2011 |

| [GHz]<br>[dB] | 26.5 | 28 | 29.5 |
|---|---|---|---|
| without EBG structure | 17.7 | 17.7 | 20.5 |
| with EBG structure | 18.2 | 17.4 | 21.1 |

| [dB] \ [GHz] | 26.5 | 28 | 29.5 |
|---|---|---|---|
| without EBG structure | 19.7 | 17.4 | 19.37 |
| with EBG structure | 23 | 17.4 | 25.1 | ns
ELECTRONIC DEVICE

CROSS-REFERENCE TO RELATED APPLICATIONS

Pursuant to 35 U.S.C. § 119, this application claims the benefit of earlier filing date and right of priority to U.S. Provisional Application No. 62/564,222, filed on Sep. 27, 2017, and also claims the benefit of Korean Application No. 10-2018-0020712, filed on Feb. 21, 2018, the contents of which are all incorporated by reference herein in their entirety.

BACKGROUND OF THE INVENTION

1. Field of the Invention

The present disclosure relates to an electronic device including a circuit board mounted with an EBG structure.

2. Description of the Related Art

Electronic devices may be implemented in the form of a multimedia device having a combination of functions such as capturing still or moving images, playing music or video files, gaming, and receiving broadcast and the like using various electronic components provided in a main body thereof.

Furthermore, in recent years, as the multimedia function of such an electronic device is expanded, an antenna capable of transmitting and receiving radio signals in various frequency bands is included therein. The antenna is connected to a wireless communication unit to transmit and receive a signal at a specific frequency under the control of the wireless communication unit.

The antenna is mounted on a circuit board to perform the role of transmitting and receiving wireless signals. The circuit board is generally manufactured using a PCB (Printed Circuit Board) board. The circuit board has a structure in which a conductive layer made of a conductive material and a dielectric layer made of an insulating material are alternately laminated. In addition, when an antenna is mounted inside the circuit board, it may be possible to secure a sufficient antenna performance while having a compact structure.

However, in order to secure the radiation performance of the antenna by positioning the antenna inside the circuit board, it is required to remove a conductive material from an area inside the circuit board that overlaps with a portion at which the antenna is positioned. The circuit board having such a structure may be deformed by an externally applied pressure or impact or high temperature, and there is a problem that wrinkle or sinking deformation may occur at a portion where the conductive material is removed.

Accordingly, schemes for modifying the structure of a circuit board composed of a plurality of layers to restrict deformation due to an externally applied physical force while allowing a patch antenna to ensure sufficient radiation performance at an operating frequency, and reducing damages that occur during manufacture or use may be required.

SUMMARY OF THE INVENTION

An object of the present disclosure is to solve the foregoing problems and other problems, and provide a structure of an electronic device capable of ensuring sufficient antenna performance at operating frequency as well as preventing deterioration in quality of a patch antenna applied to a circuit board composed of a plurality of layers.

Furthermore, another object of the present disclosure is to provide a structure of an electronic device capable of performing physical reinforcement of a circuit board mounted with a patch antenna and restricting signal interference between a plurality of patch antennas.

In order to accomplish the foregoing objectives of the present disclosure, an electronic device according to the present disclosure may include a circuit board provided within a main body of the electronic device, on which a conductive layer made of a conductive material and a dielectric layer made of an insulating material are alternately laminated; at least one or more patch antennas disposed on the circuit board; a core layer located at a central portion inside the circuit board, and configured with any one of the dielectric layers; a ground layer disposed below the core layer; and an EBG structure located inside the circuit board in a symmetrical shape at the top and bottom with respect to the core layer, and the EBG structure restricts operating frequency signals radiated from the respective patch antennas from being interfered with each other.

Here, dielectric layers laminated on the circuit board may be formed of the same dielectric material.

Furthermore, the EBG structure may include a first EBG structure disposed adjacent to an outer portion of the patch antenna and a second EBG structure spaced apart from the first EBG structure by a predetermined distance, and disposed at a circumferential portion of the circuit board. Here, the first EBG structure and the second EBG structure may be located inside the circuit board.

The first EBG structure may include a first conductive plate disposed below the core layer with respect to the core layer; and a via extended in a vertical direction to connect the first conductive plate and the ground layer.

The second EBG structure may include a second conductive plate formed of a conductive material, and the second conductive plate may be symmetrically located on upper and lower sides with respect to the core layer inside the circuit board.

The electronic device having the above structure may include a first EBG structure and a second EBG structure, thereby preventing operating frequency signals from interfering with each other between adjacent patch antennas as well as allowing efficient signal transmission and reception.

In addition, the first EBG structure and the second EBG structure may be arranged symmetrically with respect to a core layer inside the circuit board to increase a copper foil residual rate on a conductive layer where the EBG structure is positioned so as to enhance rigidity, thereby minimizing deformation due to high pressure or temperature applied to the circuit board.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1A:
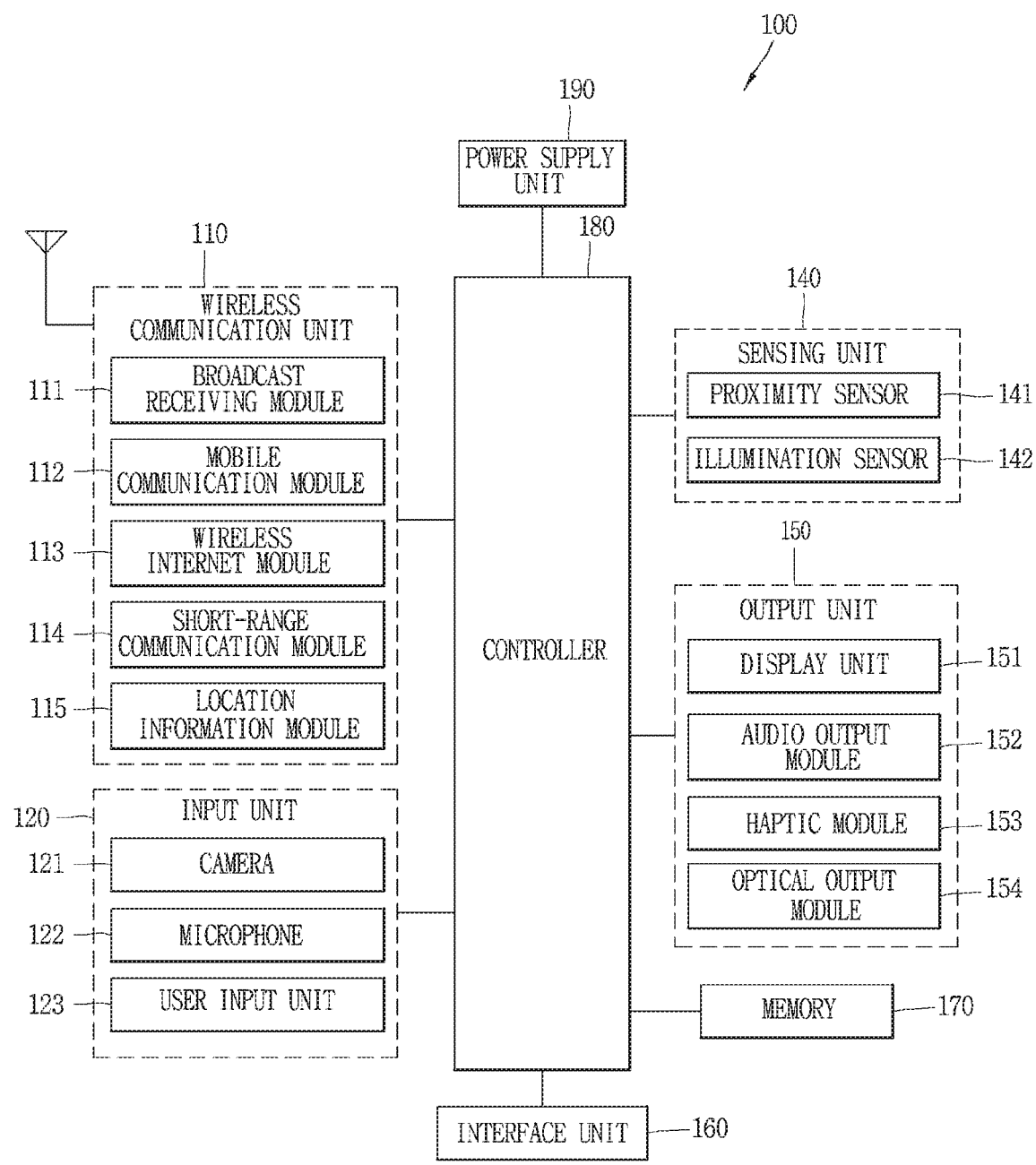
FIG. 1A is a block diagram for explaining an electronic device according to the present disclosure.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context.

Terms "include" or "has" used herein should be understood that they are intended to indicate the existence of a feature, a number, a step, a constituent element, a component or a combination thereof disclosed in the specification, and it may also be understood that the existence or additional possibility of one or more other features, numbers, steps, constituent elements, components or combinations thereof are not excluded in advance.

Electronic devices described herein may include cellular phones, smart phones, laptop computers, digital broadcasting terminals, personal digital assistants (PDAs), portable multimedia players (PMPs), navigators, slate PCs, tablet PCs, ultrabooks, wearable devices (for example, smart watches, smart glasses, head mounted displays (HMDs)), and the like.

However, it may be easily understood by those skilled in the art that the configuration according to the exemplary embodiments of this specification can also be applied to stationary terminals such as digital TV, desktop computers, digital signages, and the like, excluding a case of being applicable only to the mobile terminals.

FIG. 1A is a block diagram for explaining an electronic device 100 associated with the present disclosure.

The electronic device 100 may include a wireless communication unit 110, an input unit 120, a sensing unit 140, an output unit 150, an interface unit 160, a memory 170, a controller 180, a power supply unit 190, and the like. FIG. 1 illustrates the electronic device 100 having various components, but it may be understood that implementing all of the illustrated components is not a requirement. Greater or fewer components may alternatively be implemented.

In more detail, the wireless communication unit 110 of those components may typically include one or more modules which permit wireless communications between the electronic device 100 and a wireless communication system, between the electronic device 100 and another mobile terminal, or between the electronic device 100 and an external server. In addition, the wireless communication unit 110 may include one or more modules for connecting the electronic device 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 is typically implemented using one or more sensors configured to sense internal information of the electronic device, the surrounding environment of the electronic device 100, user information, and the like. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). The electronic device may be configured to utilize information obtained from sensing unit 140, and in particular, information obtained from one or more sensors of the sensing unit 140, and combinations thereof.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the electronic device 100 and a user, as well as functioning as the user input unit 123 which provides an input interface between the electronic device 100 and the user.

The interface unit 160 serves as an interface with various types of external devices that can be coupled to the electronic device 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The electronic device 100 may execute an appropriate control related to a connected external device, in response to the external device being connected to the interface unit 160.

In addition, the memory 170 stores data supporting various functions of the electronic device 100. The memory 170 is typically implemented to store data to support various functions or features of the electronic device 100. For instance, the memory 170 may be configured to store application programs executed in the electronic device 100, data or instructions for operations of the electronic device 100, and the like. At least some of those application programs may be downloaded from an external server via wireless communication. Some others of those application programs may be installed within the electronic device 100 at the time of being shipped for basic functions of the electronic device 100 (for example, receiving a call, placing a call, receiving a message, sending a message, etc.). On the other hand, the application programs may be stored in the memory 170, installed in the electronic device 100, and executed by the controller 180 to perform an operation (or a function) of the electronic device 100.

The controller 180 may typically control an overall operation of the electronic device 100 in addition to the operations related to the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the electronic device 100 for operation.

The power supply unit 190 may receive external power or internal power and supply appropriate power required for operating respective elements and components included in the electronic device 100 under the control of the controller 180. The power supply unit 190 may include a battery, and the battery may be an embedded battery or a replaceable battery.

At least part of those elements and components may be combined to implement operation and control of the electronic device or a control method of the electronic device according to various exemplary embodiments described herein. Furthermore, the operation and control or the control method of the electronic device may be implemented on the electronic device in such a manner of activating at least one application program stored in the memory 170.

Hereinafter, each aforementioned component will be described in more detail with reference to FIG. 1, prior to explaining various exemplary embodiments implemented by the electronic device 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the electronic device 100 to simultaneously receive at least two broadcast channels or switch the broadcast channels.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the electronic device 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the electronic device 100 and a wireless communication system, between the electronic device 100 and another mobile terminal, or between the electronic device 100 and a network where another mobile terminal (or an external server) is located, via a wireless personal area network. The short-range communication module 114 denotes a module for short-range communications.

Here, the another mobile terminal may be a wearable device, for example, a smart watch, smart glasses or a head mounted display (HMD), which is able to exchange data with the electronic device 100 (or to like data with the electronic device 100). The short-range communication module 114 may sense (recognize) a wearable device, which is able to communicate with the electronic device), near the electronic device 100. In addition, when the sensed wearable device is a device which is authenticated to communicate with the electronic device 100 according to the present disclosure, the controller 180 may transmit at least part of data processed in the electronic device 100 to the wearable device via the short-range communication module 114. Hence a user of the wearable device may use the data processed in the electronic device 100 on the wearable device. For example, when a call is received in the electronic device 100, the user may answer the call using the wearable device. Also, when a message is received in the electronic device 100, the user can check the received message using the wearable device.

The location information module 115 is generally configured to detect, calculate, derive or otherwise identify a position of the electronic device. As an example, the location information module 115 includes a Global Position System (GPS) module, a Wi-Fi module, or both. For example, when the electronic device uses the GPS module, a position of the electronic device may be acquired using a signal sent from a GPS satellite. As another example, when the electronic device uses the Wi-Fi module, a position of the electronic device may be acquired based on information related to a wireless access point (AP) which transmits or receives a wireless signal to or from the Wi-Fi module. According to the need, the location information module 115 may perform any function of the other modules of the wireless communication unit 110 to obtain data on the location of the electronic device. As a module used to acquire the location (or current location) of the electronic device, the location information module 115 may not be necessarily limited to a module for directly calculating or acquiring the location of the electronic device.

The input unit 120 may be configured to provide an audio or video signal (or information) input to the electronic device or information input by a user to the electronic device. For the input of the audio information, the electronic device 100 may include one or a plurality of cameras 121. The camera 121 processes a image frame, such as still picture or video, obtained by an image sensor in a video phone call or image capturing mode. The processed image frames may be displayed on the display unit 151. On the other hand, the plurality of cameras 121 disposed in the electronic device 100 may be arranged in a matrix configuration. By use of the cameras 121 having the matrix configuration, a plurality of image information having various angles or focal points may be input into the electronic device 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the electronic device 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the electronic device 100 to correspond to the input information. The user input unit 123 may include a mechanical input element (or a mechanical key, for example, a button, a dome switch, a jog wheel, a jog switch or the like located on a front/rear surface or a side surface of the electronic device 100), and a touch-sensitive input element. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the electronic device, surrounding environment information of the electronic device and user information, and generate a sensing signal corresponding to it. The controller 180 may control an operation of the electronic device 100 or execute data processing, a function or an operation related to an application program installed in the electronic device based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the electronic device covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving status, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the electronic device 100 to execute different operations or process different data (or information) according to whether a touch with respect to the same point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the electronic device 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. The controller 180 may calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The camera 121 and the laser sensor may be combined to detect a touch of the sensing object with respect to a 3D stereoscopic image. More specifically, the photo sensor is integrated with photo diodes and transistors in the rows and columns thereof, and a content placed on the photo sensor may be scanned by using an electrical signal that is changed according to the amount of light applied to the photo diode. Namely, the photo sensor may calculate the coordinates of the sensing object according to variation of light to thus obtain position information of the sensing object.

The display unit 151 may display (output) information processed in the electronic device 100. For example, the display unit 151 may display execution screen information of an application program driven in the electronic device 100 or user interface (UI) and graphic user interface (GUI) information in response to the execution screen information.

Furthermore, the display unit 151 may also be implemented as a stereoscopic display unit for displaying stereoscopic images.

The stereoscopic display unit may employ a stereoscopic display scheme such as stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. Also, the audio output unit 152 may also provide audible output signals related to a particular function (e.g., a call signal reception sound, a message reception sound, etc.) performed by the electronic device 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. The haptic module 153 may be implemented in two or more in number according to the configuration of the electronic device 100.

An optical output module 154 may output a signal for indicating an event generation using light of a light source. Examples of events generated in the electronic device 100 may include a message reception, a call signal reception, a missed call, an alarm, a schedule notice, an email reception, an information reception through an application, and the like.

A signal output by the optical output module 154 may be implemented in such a manner that the electronic device emits monochromatic light or light with a plurality of colors. The signal output may be terminated as the electronic device senses that a user has checked the generated event, for example.

The interface unit 160 serves as an interface for external devices to be connected with the electronic device 100. The interface unit 160 may allow a data reception from an external device, a power delivery to each component in the electronic device 100, or a data transmission from the electronic device 100 to an external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

On the other hand, the identification module may be configured as a chip for storing various information required to authenticate an authority to use the electronic device 100, which may include a User Identity Module (UIM), a Subscriber Identity Module (SIM), and the like. In addition, the device having the identification module (also referred to herein as an "identification device") may take the form of a smart card. Accordingly, the identifying device may be connected with the electronic device 100 via the interface unit 160.

The interface unit 160 may serve as a path for power to be supplied from an external cradle to the electronic device 100 when the electronic device 100 is connected to the external cradle or as a path for transferring various command signals inputted from the cradle by a user to the electronic device 100. Such various command signals or power inputted from the cradle may operate as signals for recognizing that the electronic device 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the electronic device 100 may operate in association with a web storage which performs the storage function of the memory 170 on the Internet.

As aforementioned, the controller 180 may typically control the general operations of the electronic device 100. For example, the controller 180 may set or release a locked state a lock state for restricting a user from inputting a control command with respect to applications when a state of the electronic device meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the electronic device 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

Hereinafter, a structure of an electronic device 100 according to an embodiment of the present disclosure or the terminal in which the above-described components are disposed will be described with reference to FIGS. 1B and 1C. However, the mobile terminal described below showing an example of an electronic device according to the present disclosure is taken as one example for the sake of convenience of explanation.

Figure 1B:
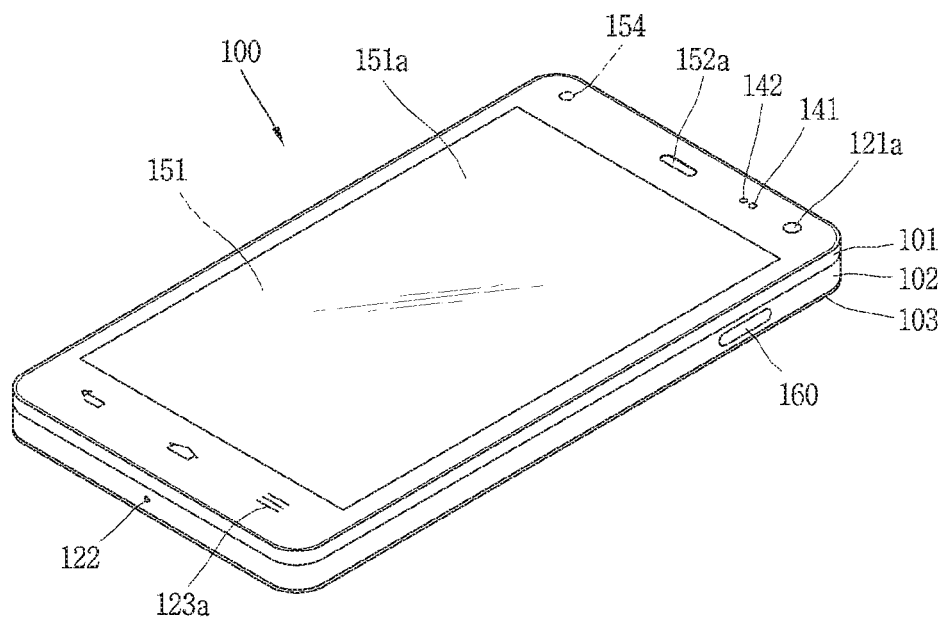
FIG. 1B is a perspective view illustrating a shape of a front portion of the electronic device.
Figure 1C:
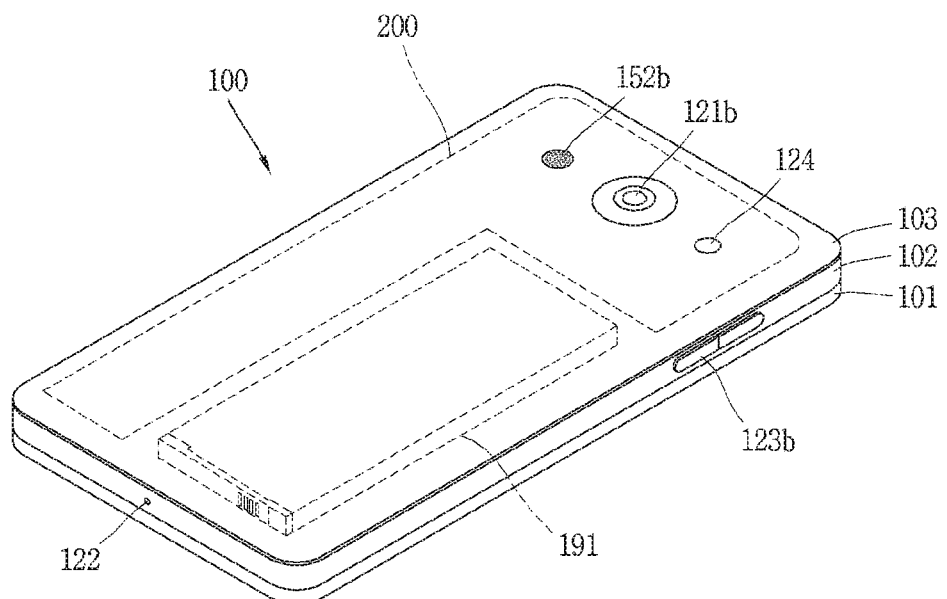
FIG. 1C is a perspective view illustrating a shape of a rear portion of the electronic device.

Referring now to FIGS. 1B and 1C, the electronic device 100 is described with reference to a bar-type terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The following description in association with a specific type of mobile terminal, but the mobile terminal is merely an example of the electronic device according to the present disclosure, and the description of a specific type of mobile terminal will be also applied to another type of mobile terminal.

Here, the terminal body may be understood as a conception which indicates the electronic device 100 as at least one assembly.

The electronic device 100 may include a case (for example, a frame, a housing, a cover, etc.) constituting the appearance thereof. As illustrated in the drawing, the electronic device 100 may include a front case 101 and a rear case 102. Various electronic components may be incorporated into a space formed between the front case 101 and the rear case 102. At least one middle case may be additionally disposed between the front case 101 and the rear case 102

A display unit 151 may be disposed on a front surface of the terminal body to output information. As illustrated, a window 151a of the display unit 151 may be mounted to the front case 101 so as to form the front surface of the terminal body together with the front case 101.

In some cases, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted to the rear case 102 may be externally exposed.

As illustrated, when the rear cover 103 is coupled to the rear case 102, a side surface of the rear case 102 may be partially exposed. In some cases, upon the coupling, the rear case 102 may also be completely shielded by the rear cover 300. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the electronic device 100 may be configured such that one case forms the inner space. In this example, the electronic device 100 having a uni-if) body formed in such a manner that synthetic resin or metal extends from a side surface to a rear surface may also be implemented.

On the other hand, the electronic device 100 may include a waterproofing unit (not shown) for preventing an introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The electronic device 100 may include a display unit 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary electronic device 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 1C.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display unit 151 may display (output) information processed in the electronic device 100. For example, the display unit 151 may display execution screen information of an application program driven in the electronic device 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented in two or more in number according to a configured aspect of the electronic device 100. For instance, a plurality of the display units 151 may be arranged on one surface to be spaced apart from or integrated with each other, or may be arranged on different surfaces.

The display unit 151 may include a touch sensor which senses a touch onto the display unit so as to receive a control command in a touching manner. When a touch is input to the display unit 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

In this manner, the display unit 151 may form a flexible touch screen along with the touch sensor, and in this case, the touch screen may function as the user input unit 123 (refer to FIG. 1A). Therefore, the touch screen may replace at least some of the functions of the first manipulation unit 123a. Hereinafter, for convenience of explanation, the display unit (display module) for outputting the image and the touch sensor are collectively referred to as a touch screen 151.

The first audio output module 152a may be implemented in the form of a receiver for transferring voice sounds to the user's ear or a loud speaker for outputting various alarm sounds or multimedia reproduction sounds.

The window 151a of the display unit 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or hidden in terms of appearance, thereby further simplifying the appearance of the electronic device 100.

The optical output module 154 may output light for indicating an event generation. Examples of the event generated in the electronic device 100 may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images obtained by the image sensor in a video call mode or a capture mode. The processed video frames may be displayed on the display unit 151 or stored in the memory 170.

The first and second manipulation units 123a and 123b are examples of the user input unit 123, which may be manipulated by a user to input a command for controlling the operation of the electronic device 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the electronic device 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap with the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

On the other hand, the electronic device 100 may include a fingerprint recognition sensor for recognizing a user's fingerprint, and the controller 180 may use fingerprint information sensed through the finger recognition sensor as an authentication means. The finger scan sensor may be installed in the display unit 151 or the user input unit 123.

The microphone 122 may be formed to receive the user's voice, other sounds, and the like. The microphone 122 may be provided at a plurality of places, and configured to receive stereo sounds.

The interface unit 160 may serve as a path allowing the electronic device 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the electronic device 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement stereophonic sound functions in conjunction with the first audio output module 152a, and may be also used for implementing a speaker phone mode for call communication.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Alternatively, an antenna may be formed in a form of film to be attached onto an inner surface of the rear cover 300 or a case including a conductive material may serve as an antenna.

A power supply unit 190 (refer to FIG. 1A) for supplying power to the electronic device 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 300 may be detachably coupled to the rear case 102.

An accessory for protecting an appearance or assisting or extending the functions of the electronic device 100 can also be provided on the electronic device 100. As one example of an accessory, a cover or pouch for covering or accommodating at least one surface of the electronic device 100 may be provided. The cover or pouch may cooperate with the display unit 151 to extend the function of the electronic device 100. Another example of the accessory may be a touch pen for assisting or extending a touch input onto a touch screen.

Hereinafter, in the present specification, a mobile terminal will be described as an example of the electronic device 100 described above for the sake of convenience of explanation.

Figure 2:
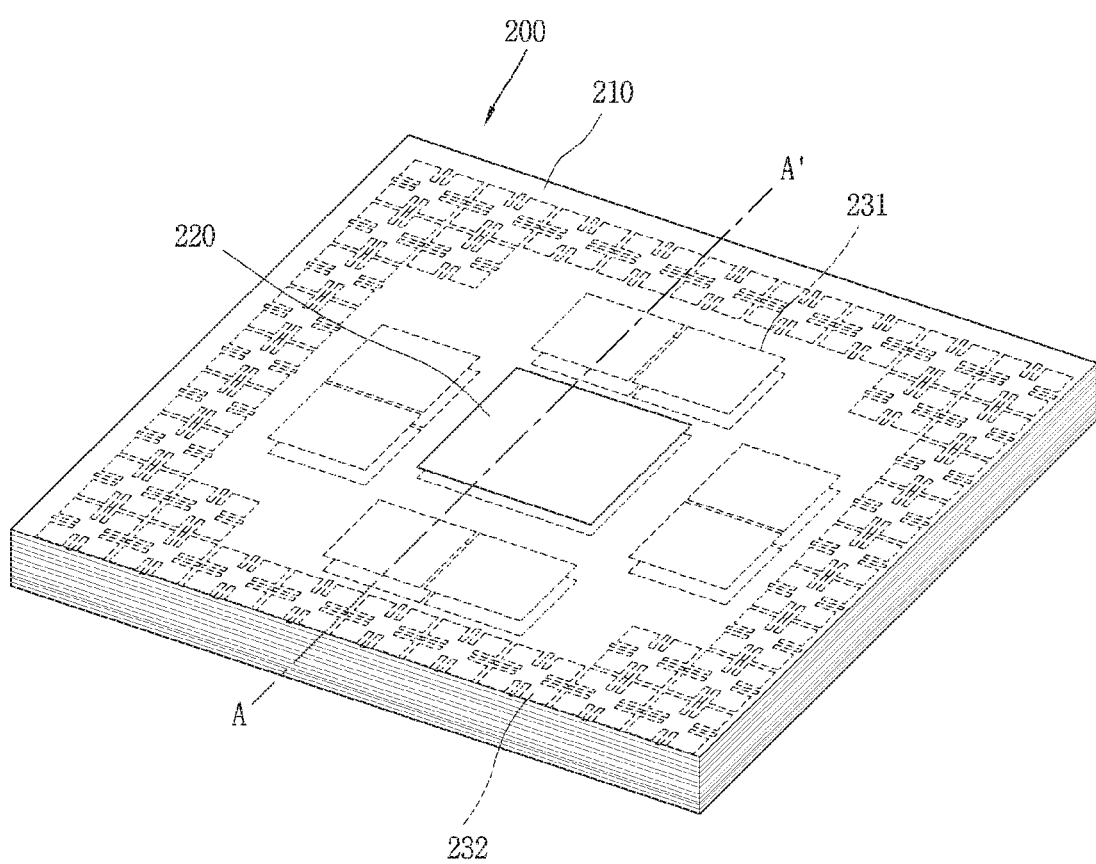
FIG. 2 illustrates a shape of a circuit board included in the electronic device.

FIG. 2 illustrates the shape of a circuit board mounted with an antenna within the electronic device 100. Here, the antenna radiator 200 may be understood as the same concept as the wireless communication unit 110 described above.

The circuit board 210 mounted with the patch antenna 220 for transmitting and receiving a signal for wireless communication is located inside the body of the electronic device. The antenna 210 is configured to transmit and receive signals to and from the outside using a selected operating frequency.

Figure 3A:
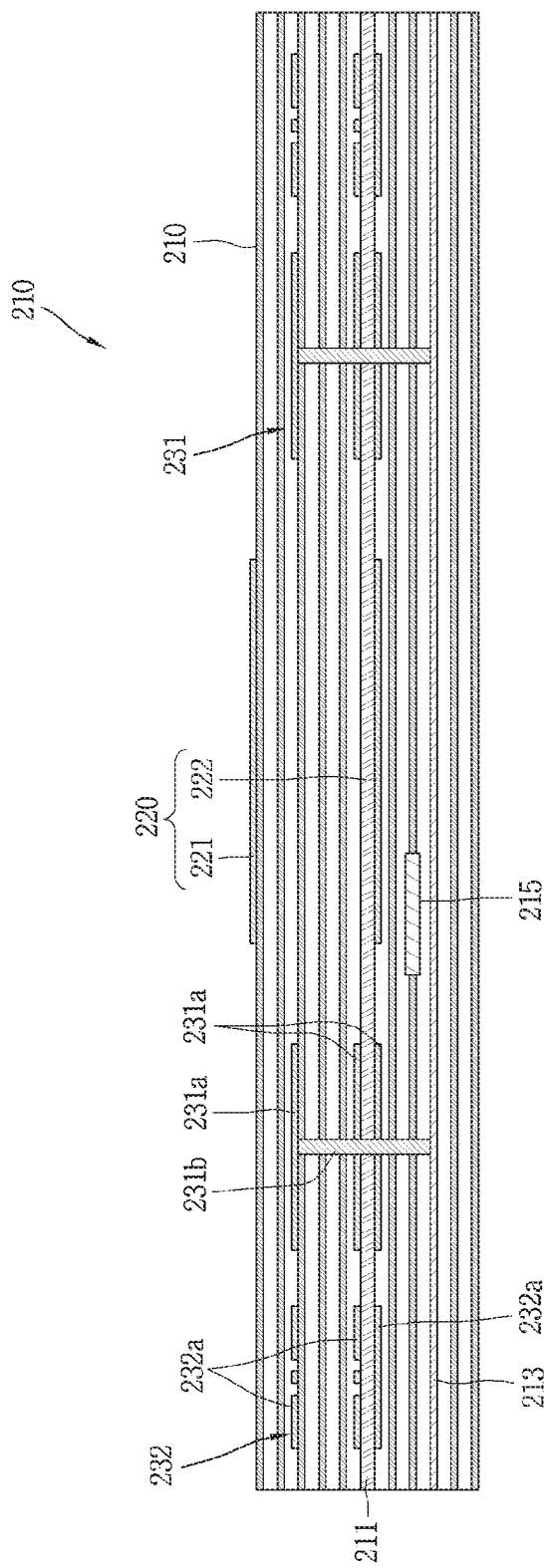
FIG. 3A is a cross-sectional view in which the circuit board of FIG. 2 is taken along line A-A'.
Figure 3B:
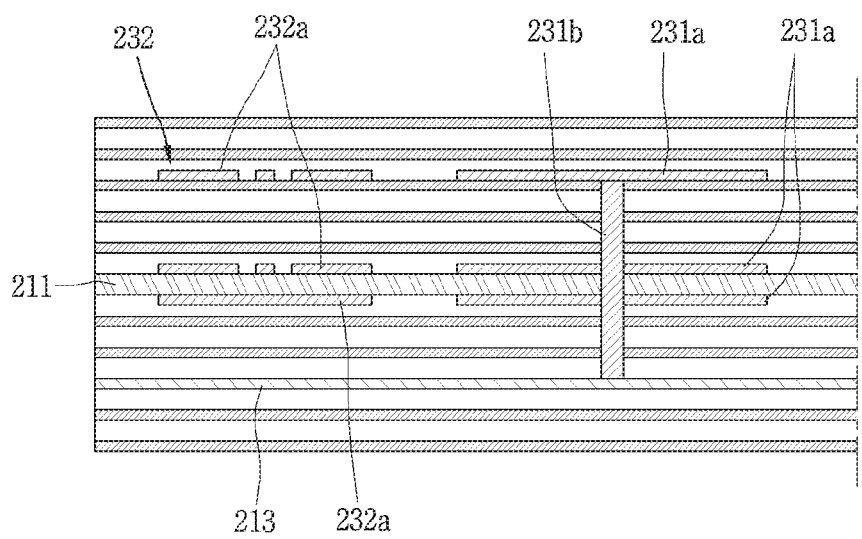
FIG. 3B is an enlarged view illustrating a shape in which a first EBG structure and a second EBG structure are located inside the circuit board.

The patch antenna 220 is provided within the circuit board 210. As illustrated in FIGS. 3A and 3B, the circuit board 210 is formed by alternately laminating a conductive layer made of a conductive material and a dielectric layer made of an insulating material. The circuit board 210 has a structure in which the conductive layer and the dielectric layer are alternately stacked.

The material of a conductive material constituting the conductive layer may be composed of any one selected from a group consisting of Ni, Cu, Ag, and the like, and for example, the conductive layer may be formed of a copper thin plate, thereby forming an electron transfer pathway.

The dielectric layer may be composed of a material having a constant dielectric constant, and each dielectric layer may be made of the same dielectric material. The dielectric layer may be formed using a material having a perovskite structure such as BaTiO3, which is a ferroelectric material, and it may also be possible to use a material having a characteristic of changing resistance according to temperature.

Here, it may also be possible to use Isora-300MD as a dielectric material for each dielectric layer formed on the circuit board 210 in the same manner.

A core layer 211 is located at the inner center of the circuit board 210. The core layer 211 may be composed of a selected one of the dielectric layers. The core layer 211 may be made of an insulating material, for example, FR4, which is one of glass epoxy materials.

A ground layer 213 is formed under the circuit board 210 to serve as a grounding portion of the circuit board 210.

The patch antenna 220 may be provided in the circuit board 210 used in the electronic device according to the present disclosure. Specifically, the patch antenna 220 may be coupled onto the circuit board 210. The patch antenna 220 may include a plurality of patches 221, 222. For example, one patch portion may be located on the circuit board 210 and the other patch portion may be located inside the circuit board 210. Each of the patch portions may be located at a position where they overlap with each other.

In addition, EBG structures 231, 232 formed in a shape symmetrical with respect to the core layer 211 may be located inside the circuit board 210.

The electro-magnetic band gap (EBG) structure is also referred to as an AMC (Artificial Magnetic Conductor) and structurally constitutes an inductance (L) and a capacitance (C) to serve as a filter, thereby restricting electromagnetic waves radiated through the patch antenna 220 from moving in an unwanted direction.

Inside the circuit board 210, the EBG structures 231, 232 having these characteristics may be located. The EBG structures 231, 232 may include a first EBG structure 231 disposed adjacent to the patch antenna 220 and a second EBG structure 232 disposed at a circumferential portion of the circuit board 210. The EBG structures 231, 232 serve to restrict frequency signals radiated from the patch antenna 220 from being interfered with each other. The detailed description of such an EBG structure will be described later.

FIG. 3A is a cross-sectional view in which the circuit board 210 of FIG. 2 is taken along line A-A', and FIG. 3B is an enlarged view illustrating a shape in which the first EBG structure 231 and the second EBG structure 232 are located inside the circuit board.

The circuit board 210 provided within the electronic device is configured with a structure in which a plurality of layers are laminated, and has a structure in which a conductive layer and a dielectric layer are repeatedly laminated.

A number of laminated layers of the circuit board 210 may be referred to based on conductive layers laminated on the circuit board 210. For example, as illustrated in FIGS. 3A and 3B, the circuit board 210 has a total of 12 conductive layers, and a dielectric layer may be disposed between each conductive layer. The conductive layer is formed of a conductive material.

In this specification, for the sake of convenience of explanation, the conductive layer located at the uppermost position is referred to as a first layer and the conductive layer located at the lowermost position is referred to as a twelfth layer. However, this is only an example, and the number of conductive layers and dielectric layers constituting the circuit board 210 may be configured in various ways.

A patch antenna 220 may be located at the center of the circuit board 210. The patch antenna 220 may be configured to transmit and receive at least one frequency band such as an LTE/WCDMA Rx Only antenna, a GPS antenna, and a BT/WiFi antenna. In addition, there may be a plurality of patch antennas 220 and located at a plurality of locations on the circuit board 210. Each of the patch antennas 220 may be configured to transmit and receive radio signals with different frequency bands.

The patch antenna 220 may be disposed on the circuit board 210 and electrically connected to the circuit board 210 to process radio signals transmitted and received by the patch antenna 220.

The patch antenna 220 includes a first patch portion 221 positioned on the circuit board 210 and a second patch portion 222 positioned inside the circuit board 210. The first patch portion 221 and the second patch portion 222 may be located on arbitrarily selected layers of the circuit board, and for example, the first patch portion 221 may also be disposed on the first layer, and the second patch portion 222 on the seventh layer.

A feeding member 215 may be located below the second patch portion 222 constituting the patch antenna 220. The feeding member 215 is connected to an electronic device to perform the role of transmitting a signal generated from the circuit device. The feeding member 215 is formed in a thin plate shape and configured to extend in one direction. The feeding member 215 may be configured with a conductor.

Inside the circuit board 210, the EBG structures 231, 232 are located. The EBG structures 231, 232 serve to restrict frequency signals radiated from the patch antenna 220 from being interfered with each other.

The EBG structures 231, 232 may include a first EBG structure 231 disposed adjacent to the patch antenna 220 and a second EBG structure 232 disposed at a circumferential portion of the circuit board 210.

Here, since the first EBG structure 231 is formed in a mushroom shape, it is referred to as a mushroom-EBG, and the second EBG structure 232 is also referred to as a UC-EBG.

The first EBG structure 231 may be located along an outer circumference of the patch antenna 220 and disposed adjacent to the patch antenna 220.

The first EBG structure 231 is located inside the circuit board 210. The first EBG structure 231 may include a first conductive plate 231a disposed below the core layer 211 and a via 231b extending in a vertical direction and connecting the first conductive plate 231a to the ground layer 213.

The first conductive plate 231a may be configured in a thin plate shape formed of a conductive material. A plurality of first conductive plates 231a may be disposed in such a manner that different first conductive plates 231a are located to be symmetrical to each other with respect to the core layer 211. Furthermore, the first conductive plates 231a may be located at the same distance from the ground layer 213 with respect to the core layer 211 in a vertical direction.

When a plurality of first conductive plates 231a made of a conductive material are located to be symmetrical to each other with respect to the core layer 211 inside the circuit board 210, even though a physical shock or high temperature is applied to the circuit board 210, the stress may be uniformly distributed on the circuit board 210, thereby having an advantage in securing rigidity.

When the patch antenna 220 is placed on the circuit board 210 composed of a plurality of layers, a vacant area free of a conductor is required in a region where the patch antenna 220 is located. When a high pressure or temperature is applied to a region where such a conductor is not present, wrinkle may occur, thereby deteriorating the quality of the circuit board.

As a result, when the EBG structures are located on upper and lower sides around the core layer 211, a conductor may be filled in the corresponding region, thereby preventing the circuit board from being wrinkled.

As illustrated in FIG. 3B, the first conductive plates 231a are formed at upper and lower portions with respect to the core layer 211, respectively, on the first EBG structure 231 located on the left side of the patch antenna 220 The first conductive plate 231a of the first EBG structure 231 located adjacent to the patch antenna 220 performs the role of preventing a signal radiated from the patch antenna 220 from being transmitted to another adjacent patch antenna 220.

Figure 4A:
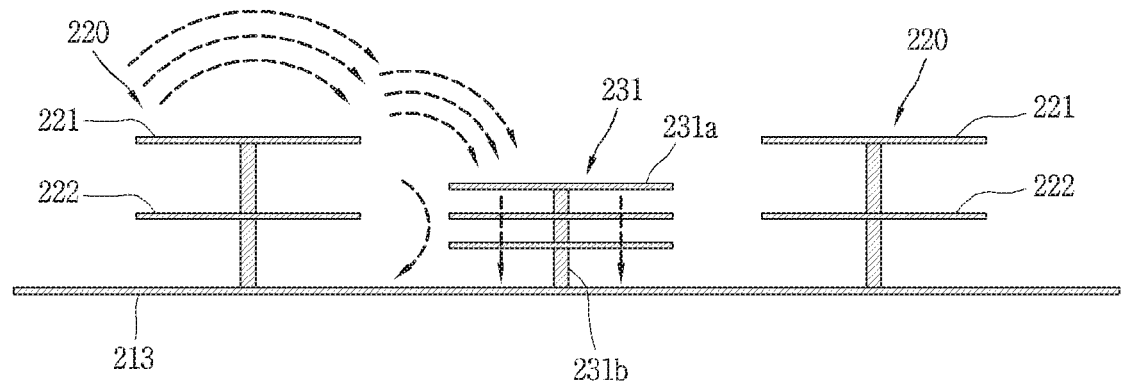
FIG. 4A is a view illustrating a shape in which the first EBG structure is disposed between patch antennas.
Figure 4B:
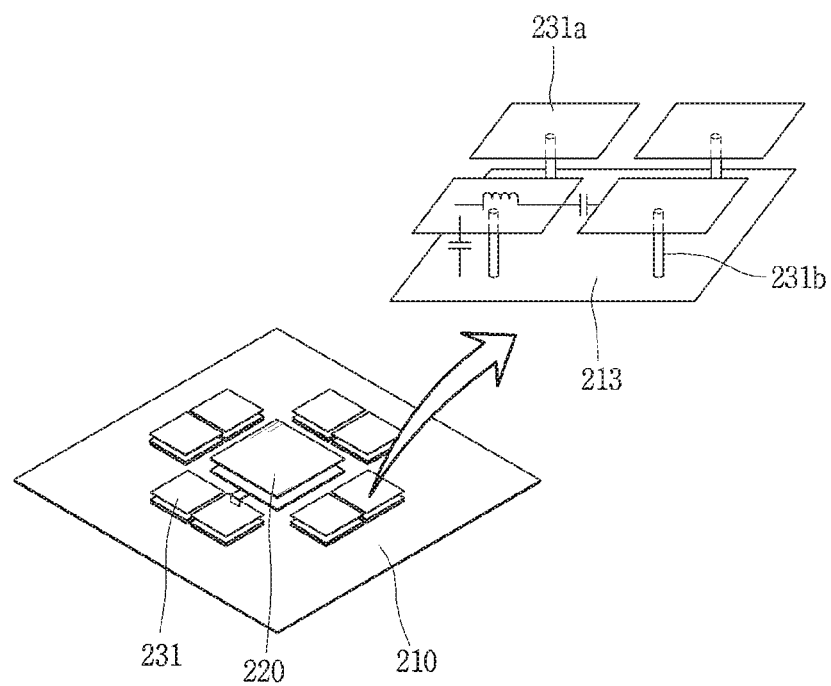
FIG. 4B is a conceptual view illustrating an internal structure of the first EBG structure.

FIG. 4A is a view illustrating a shape in which the first EBG structure 231 is disposed between patch antennas 220, and FIG. 4B is a conceptual view illustrating an internal structure of the first EBG structure 231.

The first EBG structure 231 may be located between different patch antennas 220 disposed on the circuit board 210, and may perform the role of preventing the interference of operating frequency signals radiated between the different patch antennas 220.

The first conductive plate 231a of the first EBG structure 231 serves as an inductance (L), and a via 231b connected to the first conductive plate 231a and extended in a vertical direction to connect with the ground layer 213 serves as a capacitance (C), and thus it may be possible to restrict a signal at a driving frequency radiated from the patch antenna 220 from being radiated to another adjacent patch antenna 220. In other words, the first conductive plate 231a and the via 231b of the first EBG structure 231 may serve as an LC filter that restricts a frequency signal of the patch antenna 220 from being transmitted.

The first EBG structure 231 has a structure including a first conductive plate 231a located at the top and a via 231b for connecting the first conductive plate 231a to the ground layer 213.

Figure 6:
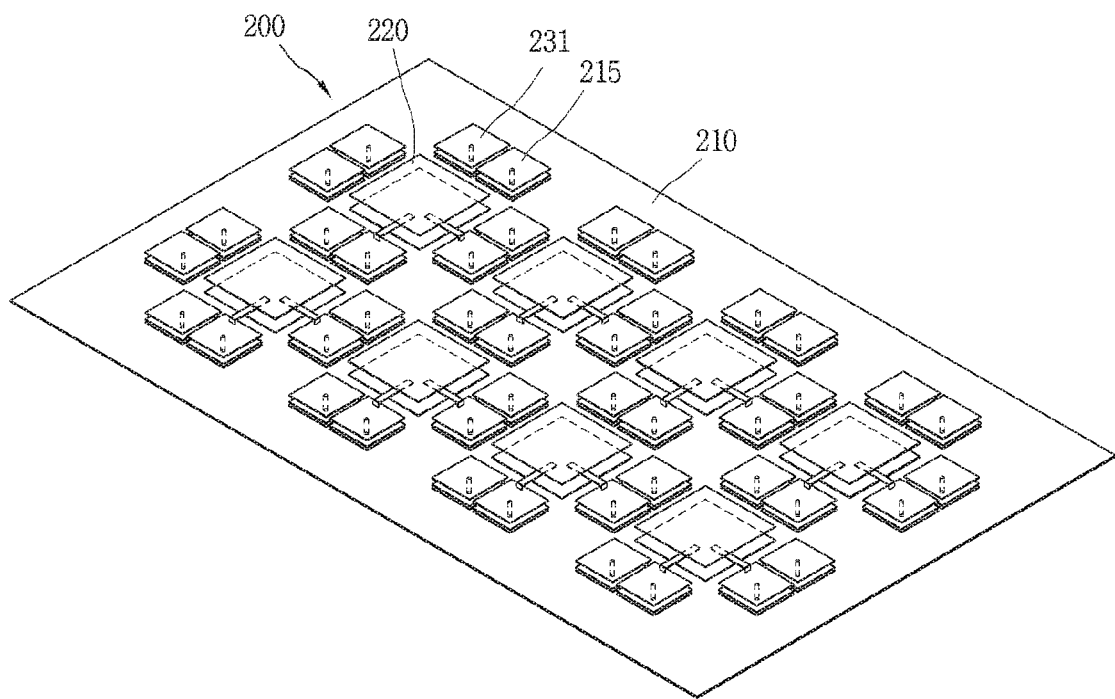
FIG. 6 is a perspective view in which a circuit board according to the present disclosure is seen from the outside.

For the first EBG structure 231, it is required to operate as a pair of two first EBG structures 231 adjacent to the patch antenna 220, and therefore, as illustrated in FIG. 6, a pair of two first EBG structures 231 are arranged on the front, rear, left and right sides of the patch antenna 220.

Accordingly, a capacitance is generated between the first conductive plates 231a located at the top, and an inductance is generated by a current flowing downward along the via 231b from the first conductive plate 231a located at the top and then flowing upward again to the conductive plate 231a located at the top to generate an LC resonance. When the values of the inductance (L) and the capacitance (C) are adjusted, it may be possible to block the propagation of a desired frequency.

The second EBG structure 232 may include a second conductive plate 232a formed of a conductive plate. The second conductive plate 232a may be formed of a plurality of conductive plates and located inside the circuit board 210 in a shape symmetrical to the upper and lower portions with respect to the core layer 211. The second EBG structure 232 may be located such that different second conductive plates 232a are symmetrical with respect to the core layer 211 at the upper and lower ends thereof. For example, the second conductive plate 232a may be located at the same distance as the ground layer 213 with respect to the core layer 211. When the second conductive plate 232a is positioned symmetrically with respect to the core layer 211, a copper foil residual rate in the relevant layer is increased, it will perform the role of preventing deformation even if physical force or high temperature is applied to the circuit board 210.

As illustrated in FIGS. 3A and 3B, the circuit board 210 may be configured to have a plurality of conductive layers including a conductive material. In FIGS. 3A and 3B, the conductive layer indicates a portion with a dark hatched area.

Since the EBG structure is located inside the circuit board 210, the copper foil residual rate of the conductive layer on which the first conductive plate 231a or the second conductive plate 232a of the EBG structure is located may be increased, thereby sufficiently ensuring the rigidity of the circuit board 210.

FIG. 3B is a conceptual view illustrating a shape in which the EBG structure is located on the circuit board 210.

As described above, the first EBG structures 231 may be located symmetrically with respect to the core layer 211, and a method of locating the first EBG structure 231 inside the circuit board 210 may be carried out in various modified ways.

As illustrated in FIG. 3B, for example, the first EBG structure 231 has a structure in which a dielectric layer and a conductive layer are alternately laminated on the core layer 211 to form a total of 12 conductive layers. It is assumed that the ground layer 213 is located in the tenth layer.

For example, when two conductive layers are arbitrarily selected to locate the EBG structure, the second EBG structure 232 may be located in the third layer so as to correspond to the ground layer 213 made of a conductor. When four conductive layers are arbitrarily selected to located the EBG structures, a first layer, a third layer, a tenth layer, and a twelfth layer may be selected to locate the first EBG structure 231 or the second EBG structure 232. Furthermore, it may also be possible to select a second layer, a third layer, a tenth layer and an eleventh layer to locate the second EBG structure 231 or the second EBG structure 232. As described above, various conductive layers may be selected to arrange the EBG structures. However, the first EBG structure 231 and the second EBG structure 232 should be respectively arranged in a symmetric manner with respect to the core layer 211. Through this, it may be possible not only to ensure the rigidity of the circuit board 210 but also to restrict signals between a plurality of installed patch antennas 220 from being interfered with each other.

Figure 5A:
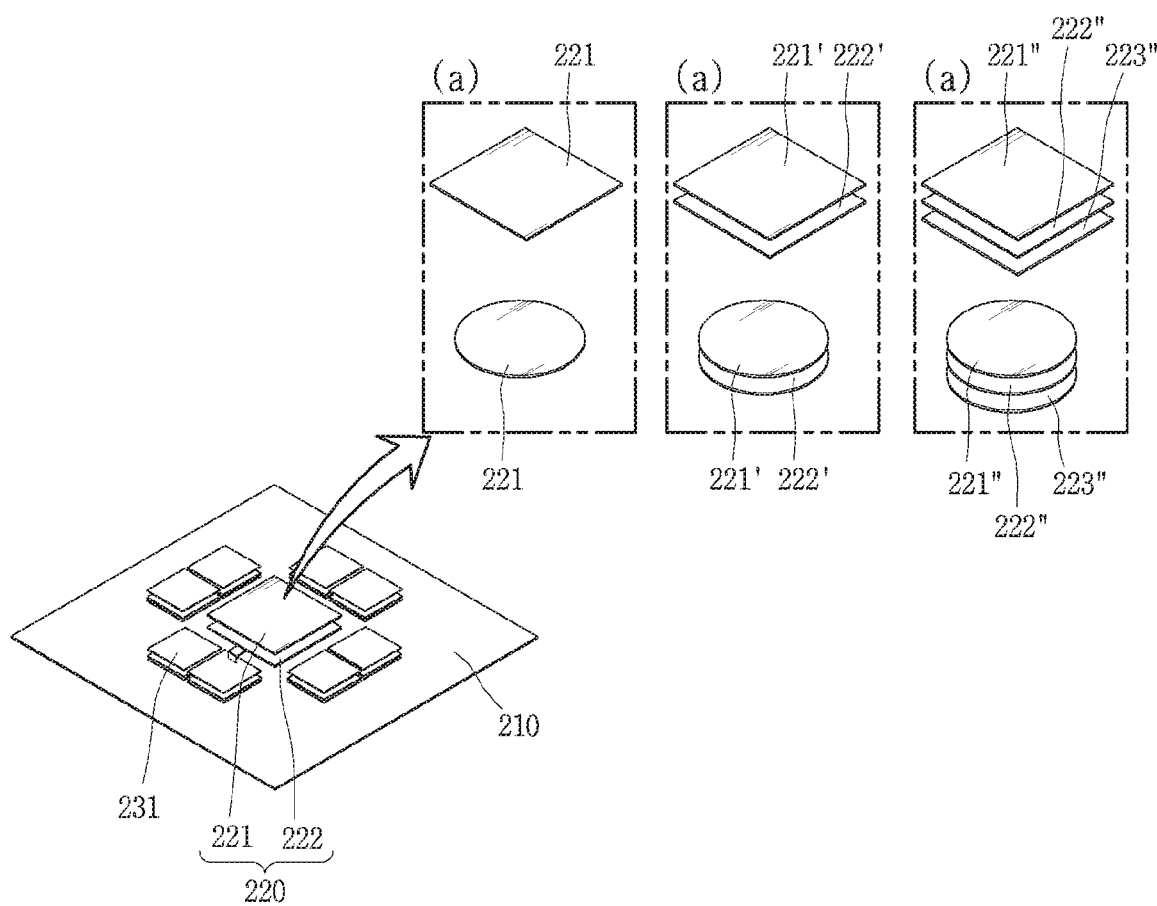
FIG. 5A is a view illustrating various deformable embodiments of a patch antenna disposed on a circuit board.
Figure 5B:
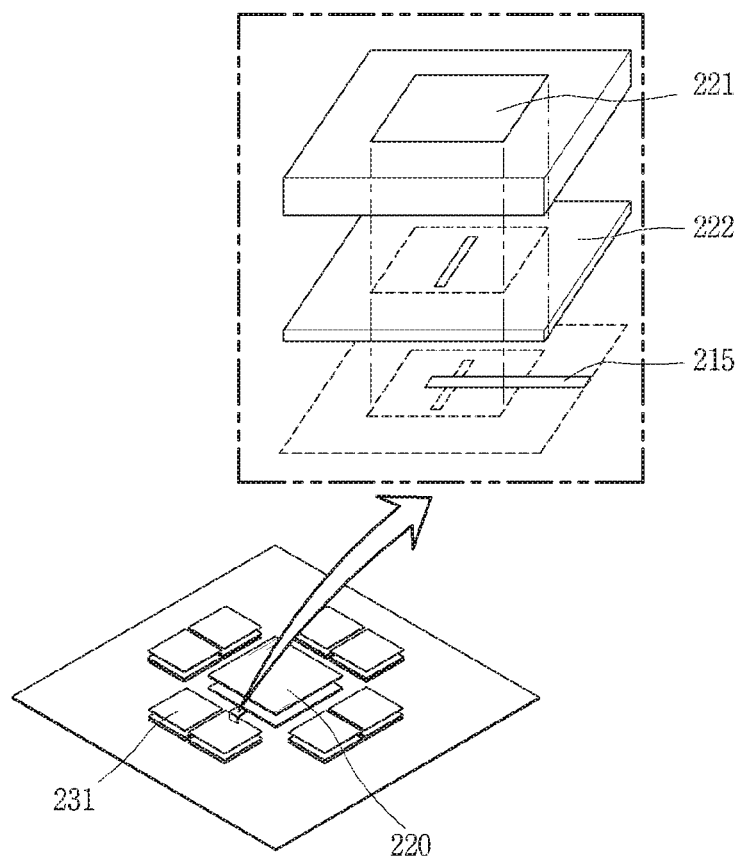
FIG. 5B is a view illustrating an arrangement relationship between a patch antenna and a feeding member.

FIG. 5A illustrates a deformable shape of the patch antenna 220 disposed on the circuit board 210, and FIG. 5B is a view illustrating an arrangement relationship between the patch antenna 220 and the feeding member 215.

The patch antenna 220 located on the circuit board 210 may be carried out in various modified manners as illustrated in FIGS. 5A(a), 5A(b), and 5A(c).

The patch antenna 220 may be configured with one patch portion 221 and located on the circuit board 210 as illustrated in FIG. 5A(a), or a plurality of patches 221', 222', 221", 222", 223" may be vertically arranged at an overlapping position as illustrated in FIGS. 5A(b) and 5A(c).

For example, the first patch portion 221 and the second patch portion 222, which are different from each other, may be vertically disposed on different conductive layers formed on the circuit board 210.

Furthermore, the patch portions of each patch antenna 220 may be generally formed with rectangular plate shapes 221, 221', 222', 221", 222", 223", or may also be formed with a circular plate shapes.

As illustrated in FIG. 5B, the feeding member 215 may be located below the patch antenna 220 configured with the first patch portion 221 and the second patch portion 222. The feeding member 215 is located on a conductive layer inside the circuit board 210 and may be formed in a plate shape extended in one direction.

The feeding member 215 may be formed of a conductive material, and connected to a port extended from an electronic device to perform the role of transmitting power or allowing impedance matching. The feeding member 215 may be directly contacted and connected to one surface of either one of the first patch portion 221 and the second patch portion 222 of the patch antenna 220. However, since it is possible to transmit the power using an indirect power feeding method, it may also be possible to be located without being in direct contact with the patch antenna 220.

Figure 7:
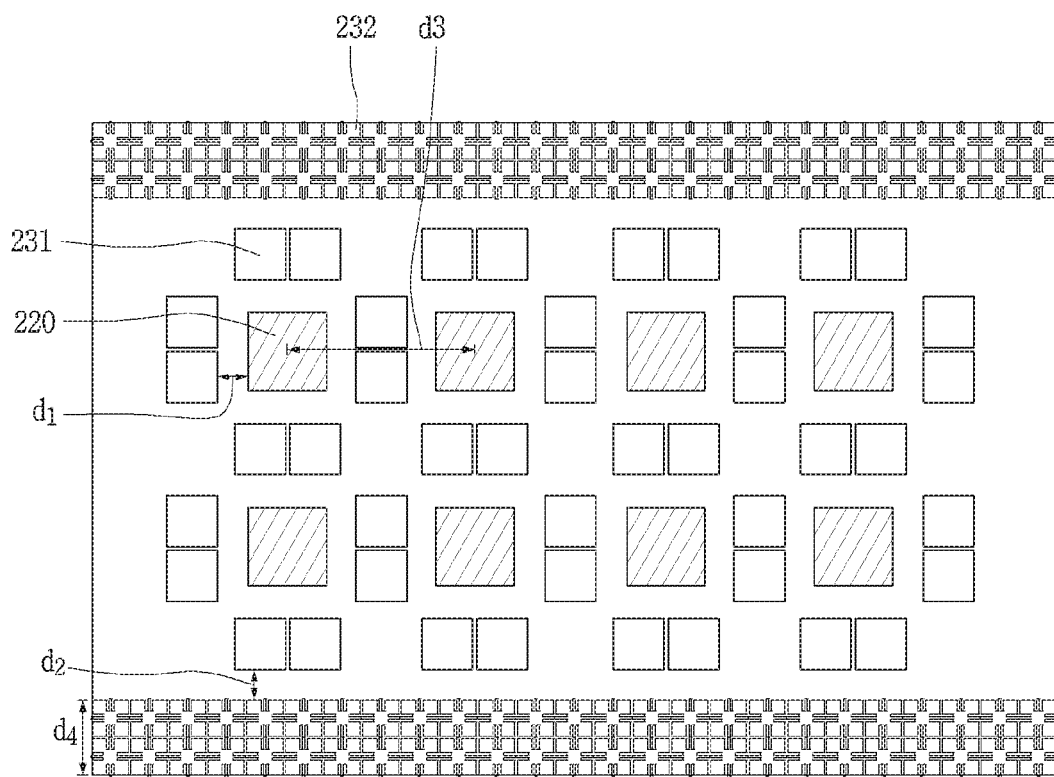
FIG. 7 is a conceptual view in which the circuit board is projected from above.

FIG. 6 is a perspective view in which an circuit board 210 according to the present disclosure is seen from the outside, and FIG. 7 is a conceptual view in which the circuit board 210 is projected from above.

As described above, a plurality of patch antennas 220 may be disposed on the circuit board 210. A distance (d3) between the centers of the respective patch antennas 220 is preferably disposed to have a distance equal to or greater than a half of a wavelength of a signal radiated from the patch antenna 220 to restrict an interference between different patch antennas 220 between patch antennas 220 disposed adjacent to each other.

The first EBG structure 231 may be disposed around the patch antenna 220. The patch antenna 220 may be configured to overlap a plurality of patch portions. A different first EBG structure 231 is disposed at each corner of the patch antenna 220 having a rectangular shape.

The first EBG structure 231 may be spaced apart from the patch antenna 220 by a predetermined distance with the patch antenna 220 interposed therebetween. The first EBG structure 231 may be disposed in such a manner that a distance between the center of the patch antenna 220 and the center of the first EBG structure 231 is a value of a quarter of a wavelength of a signal radiated from the patch antenna 220.

Here, in order to prevent the radiation performance of the patch antenna 220 from deteriorating, it is preferable to have a distance (d1) equal to or greater than $1/16$ of a wavelength of a signal radiated from the patch antenna 220 between the first EBG structure 231 and the patch antenna 220.

In addition, as illustrated in FIG. 7, the second EBG structure 232 may be disposed to be spaced apart from the first EBG structure 231 in a direction away from the patch antenna 220. The second EBG structure 232 may include a second conductive plate 232a formed with a conductive plate. The second conductive plate 232a may be formed with a plurality of conductive plates, and located at a circumference of the circuit board 210.

A distance (d2) between the second EBG structure 232 and the first EBG structure 231 may be disposed to have a distance equal to or greater than $1/16$ of a wavelength value of a signal radiated from the patch antenna 220.

If it has a distance less than a wavelength value of a signal radiated from the patch antenna 220 between the second EBG structure 232 and the first EBG structure 231, it may cause an effect in which a capacitance is disposed between the first EBG structure 232 and the second EBG structure 232, thereby causing the performance deterioration of the EBG structure.

In addition, as illustrated in FIG. 7, the second EBG structure 232 may be formed to have a width (d4, in a vertical direction on the drawing) equal to or greater than a wavelength value of a signal radiated from the patch antenna 220. When a minimum width of the second EBG structure 232 is equal to or greater than $1/4$ of a wavelength value of a signal radiated from the patch antenna 220, a phase difference between a reflected surface wave and an incident surface wave may be 180 degrees to cancel each other.

FIG. 7 illustrates a shape in which the second EBG structure 232 is formed on the upper and lower circumferential portions of the circuit board 210, but the second EBG structure 232 may also be additionally formed on the left and right circumferential portions. However, as described above, a minimum width of the second EBG structure 232 should be disposed to be equal to or greater than $1/4$ of a wavelength value of a signal radiated from the patch antenna 220 for the performance of the second EBG structure 232.

Figure 8A:
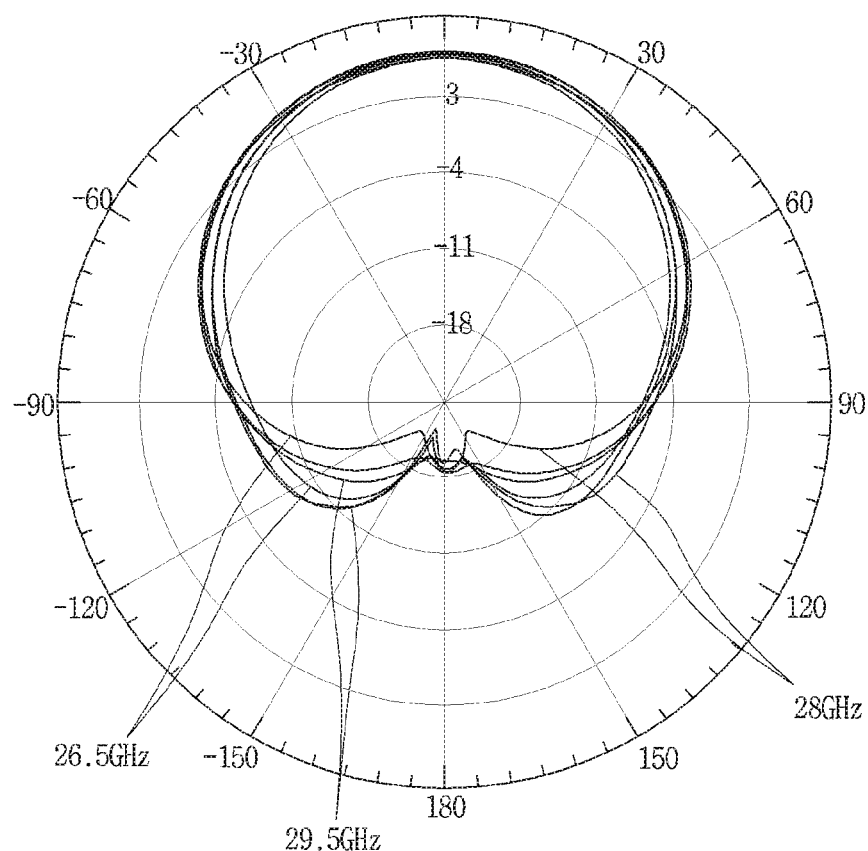
FIG. 8A is a graph illustrating a radiation performance of the electronic device according to the present disclosure.
Figure 8B:
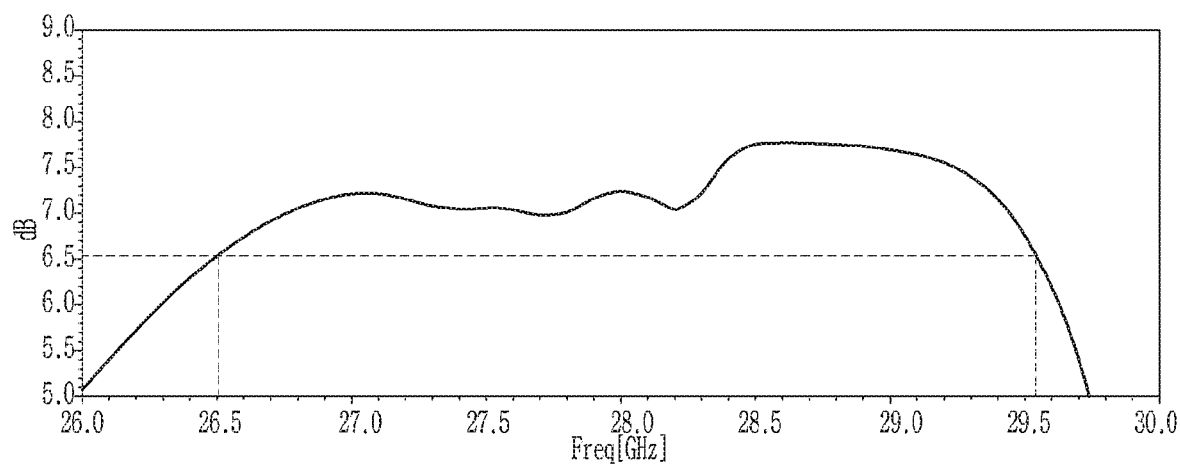
FIG. 8B is a graph illustrating a radiation performance of a gain value of a patch antenna according to frequency when the circuit board according to the present disclosure is included.

FIG. 8A is a graph illustrating the radiation performance of the patch antenna 220 by angles when the circuit board 210 according to the present invention is included, and FIG. 8B is a graph illustrating a gain value of the patch antenna 220 according to a frequency when the circuit board 210 according to the present invention is included.

As described above, the circuit board 210 according to the present disclosure includes a first EBG structure 231 and a second EBG structure 232 adjacent to the patch antenna 220 located on the circuit board 210.

As illustrated in FIG. 8A, even when the first and second EBG structures are disposed around the patch antenna 220, it is confirmed that a normal radiation pattern is formed at each angle without radiation pattern distortion or performance deterioration in a direction in which the patch antenna 220 is viewed even at operating frequencies of 26.5 GHz, 28 GHz, and 29.5 GHz.

In addition, referring to the graph of FIG. 8B, it is confirmed that a gain of the patch antenna 220 is 6.5 dBi or more at 26.5 GHz to 29.5 GHz, which are the operating frequencies of the patch antenna 220.

Specifically, the gain of the antenna is 6.5 dBi when the operating frequency of the antenna is 26.5 GHz, 6.9 dBi at 28 GHz, and 7 dBi at 29.5 GHz.

Here, dBi (decibels relative to an isotropic antenna) denotes an isotropic antenna reference decibel, which is a value expressed in decibels with respect to an isotropic antenna as an antenna gain. It denotes a relative unit in which a power density in a specific direction of an antenna at a predetermined distance is expressed in logarithm with respect to a power density of an isotropic antenna at the same distance.

Figures 9A, 9B:
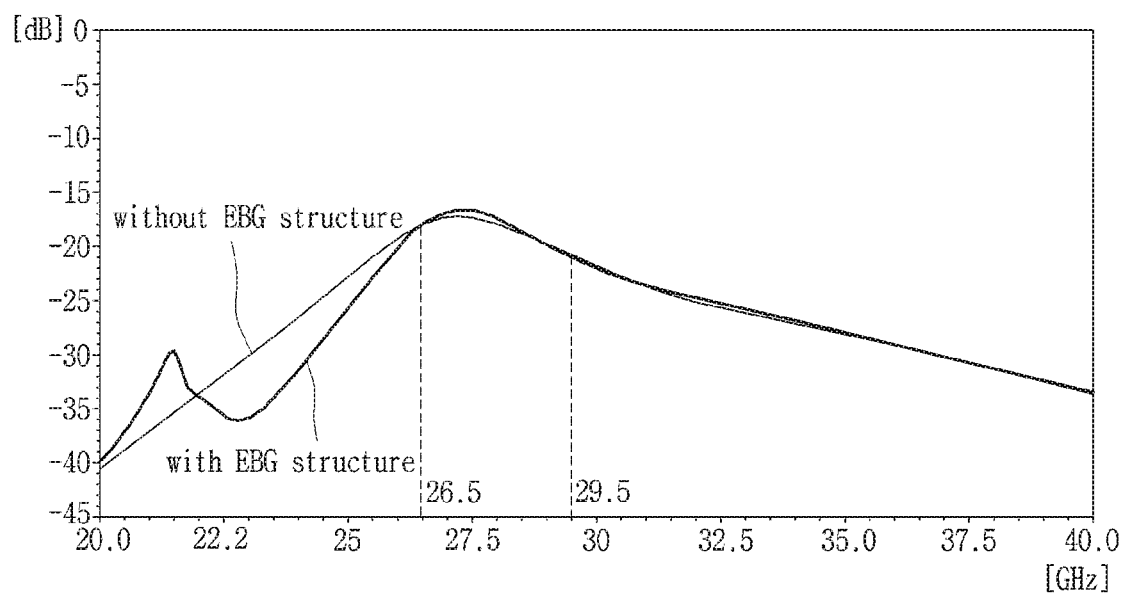
FIGS. 9A and 9B are graphs illustrating a degree of isolation between a plurality of patch antennas arranged in a transverse direction and resultant values thereof.

FIGS. 9A and 9B are graphs and resultant values illustrating a degree of isolation between the patch antennas 220 with respect to a horizontal direction when a plurality of patch antennas 220 are disposed on the circuit board 210 in case where the EBG structure is included within the circuit board 210 according to the present disclosure and in case where not included therewithin.

As illustrated in FIGS. 9A and 9B, it can be seen that a cut-off frequency interfered between adjacent patch antennas 220 in case where the first EBG structure 231 and the second EBG structure 232 are included in the circuit board 210 is larger than that in case where not included in the circuit board, between 26.5 GHz and 29.5 GHz, which are the operating frequencies of the patch antenna 220. This cutoff value is also referred to as a degree of isolation, and the larger an absolute value of the cutoff value, the more interference between adjacent patch antennas 220 does not occur.

When the first EBG structure 231 and the second EBG structure 232 are included in the circuit board 210, a value of isolation degree obtained at 26.5 Ghz is 18.2 dB, and a value of isolation degree obtained at 29.5 GHz is 21.1 dB. A value of isolation degree in case where the first EBG structure 231 and the second EBG structure 232 are included in the circuit board 210 is larger than that in the case where not included the circuit board 210.

Figures 10A, 10B:
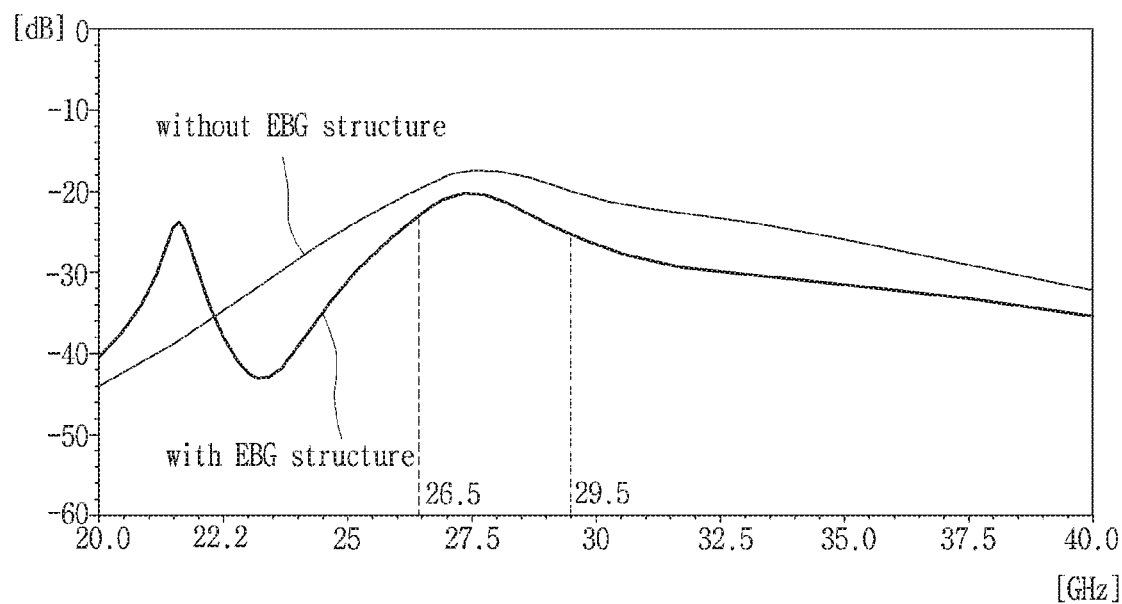
FIGS. 10A and 10B are graphs and resultant values illustrating a degree of isolation between a plurality of patch antennas arranged in a longitudinal direction.

FIGS. 10A and 10B are graphs and resultant values illustrating a degree of isolation between the patch antennas 220 with respect to a longitudinal direction when a plurality of patch antennas 220 are disposed on the circuit board 210 in case where the EBG structure is included in the circuit board 210 according to the present disclosure and in case where not included therein.

It can be seen that a cut-off frequency interfered between adjacent patch antennas 220 in case where the first EBG structure 231 and the second EBG structure 232 are included in the circuit board 210 is larger than that in case where not included in the circuit board, between 26.5 GHz and 29.5 GHz, which are the operating frequencies of the patch antenna 220.

A value of isolation degree obtained at 26.5 Ghz in case where the first EBG structure 231 and the second EBG structure 232 are included in the circuit board 210 is 23 dB, and the value of isolation degree obtained at 29.5 GHz is 25.1 dB, which is larger than that in case where the first EBG structure 231 and the second EBG structure 232 are not included in the circuit board 210.

Figure 11A:
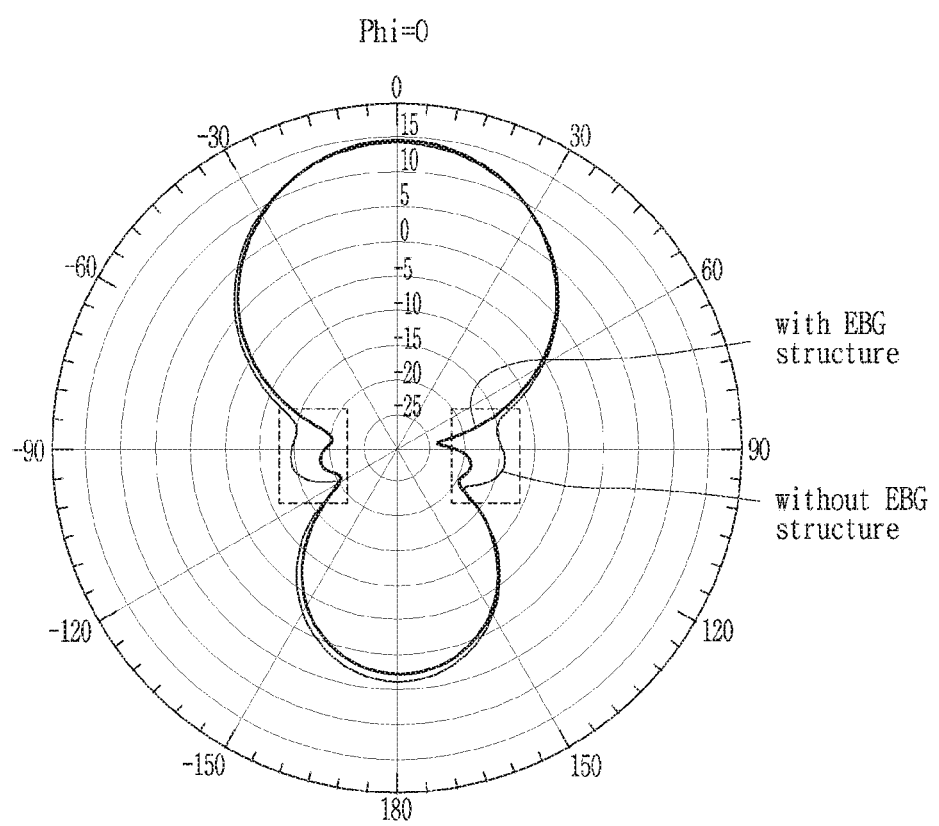
FIG. 11A is a graph illustrating a radiation pattern of a plurality of patch antennas when the patch antennas are arranged in a longitudinal direction.

FIG. 11A is a graph illustrating a radiation pattern of the patch antenna 220 when a plurality of patch antennas 220 are arranged in a longitudinal direction when the operating frequency of the patch antenna 220 is 28 GHz in case where the EBG structure is included in the circuit board 210 according to the present disclosure and in case where not included therein.

Referring to a dotted box portion in a graph of FIG. 11A, it can be seen that when the EBG structure is not included in the circuit board 210 surface waves are transmitted between different patch antennas 220 arranged in a longitudinal direction to increase a value causing interference between adjacent patch antennas 220.

Figure 11B:
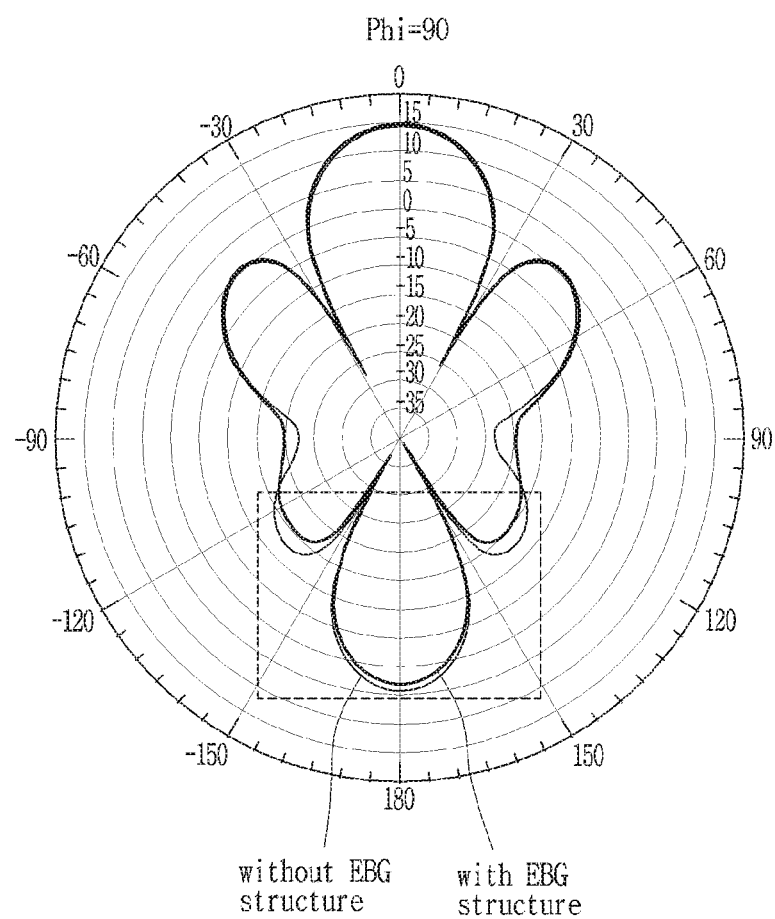
FIG. 11B is a graph illustrating a radiation pattern of a plurality of patch antennas when the patch antennas are arranged in a traverse direction.

FIG. 11B is a graph illustrating a radiation pattern of the patch antenna 220 when a plurality of patch antennas 220 are arranged in a transverse direction when the operating frequency of the patch antenna 220 is 28 GHz.

Referring to a dotted box portion in a graph of FIG. 11B, it can be seen that when the EBG structure is not included in the circuit board 210, surface waves are transmitted between different patch antennas 220 arranged in a transverse direction to increase a value causing interference between adjacent patch antennas 220.

The detailed description of the foregoing present disclosure should not be construed as restrictive in all aspects but considered as illustrative. The scope of the invention should be determined by reasonable interpretation of the appended claims and all changes that come within the equivalent scope of the invention are included in the scope of the invention.

What is claimed is:

1. An electronic device, comprising:
   a circuit board provided within a main body of the electronic device and comprising alternating laminated layers of a conductive layer made of a conductive material and a dielectric layer made of an insulating material;
   a plurality of patch antennas disposed on the circuit board;
   a core layer disposed at a central layered portion inside the circuit board and comprising a dielectric layer;
   a ground layer disposed below the core layer; and
   electro-magnetic band gap (EBG) structures disposed inside the circuit board and configured to restrict interference between signals radiated from the plurality of patch antennas.

2. The electronic device of claim 1, wherein the dielectric layers of the alternating laminated layers are formed of the same dielectric material.

3. The electronic device of claim 1, wherein the EBG structures comprise:
   a first EBG structure disposed adjacent to one of the plurality of patch antennas; and
   a second EBG structure spaced apart from the first EBG structure and disposed adjacent to an outer portion of the circuit board.

4. The electronic device of claim 3, wherein the first EBG structure and the second EBG structure are disposed inside the circuit board.

5. The electronic device of claim 3, wherein the first EBG structure comprises:
   a first conductive plate disposed below the core layer; and
   a via configured to electrically connect the first conductive plate and the ground layer.

6. The electronic device of claim 5, wherein the first conductive plate is one of a plurality of first conductive plates symmetrically located in a vertical direction with respect to the core layer.

7. The electronic device of claim 6, further comprising another first conductive plate, wherein the another first conductive plate and the ground layer are symmetrically located with respect to the core layer in the vertical direction.

8. The electronic device of claim 5, wherein the via is configured to extend through the core layer.

9. The electronic device of claim 3, wherein a plurality of first EBG structures surround the patch antenna and are spaced apart from the patch antenna by a predetermined distance.

10. The electronic device of claim 9, wherein one of the plurality of first EBG structures is spaced apart from the patch antenna by a distance greater than or equal to $\frac{1}{16}$ of a wavelength of a signal radiated from the patch antenna.

11. The electronic device of claim 3, wherein the first EBG structure is disposed between the one of the plurality of patch antennas and the second EBG structure.

12. The electronic device of claim 3, wherein the second EBG structure comprises a plurality of second conductive plates formed of a conductive material and symmetrically located with respect to the core layer in a vertical direction inside the circuit board.

13. The electronic device of claim 12, further comprising another second conductive plate, wherein the another second conductive plate and the ground layer are symmetrically located with respect to the core layer in the vertical direction.

14. The electronic device of claim 3, wherein a plurality of second EBG structures are disposed toward an outer region of the first EBG structure and spaced apart from the first EBG structure by predetermined distances.

15. The electronic device of claim 3, wherein the first EBG structure and the second EBG structure are spaced apart by a distance greater than or equal to $\frac{1}{16}$ of a wavelength of a signal radiated from the one of the plurality of patch antennas.

16. The electronic device of claim 3, wherein the first EBG structure and the second EBG structure are formed of a conductive material.

17. The electronic device of claim 1, wherein the core layer is located at a central portion of the circuit board in a vertical direction.

18. The electronic device of claim 1, wherein each of the plurality of patch antennas comprises a plate-shaped first patch portion and a plate-shaped second patch portion arranged to be overlapped with each other and vertically separated by a predetermined distance inside the circuit board.

19. The electronic device of claim 18, further comprising a feeding member electrically connected to the first patch portion or the second patch portion.

* * * * *